US011499987B2

(12) United States Patent
McNeil et al.

(10) Patent No.: US 11,499,987 B2
(45) Date of Patent: Nov. 15, 2022

(54) Z-AXIS INERTIAL SENSOR WITH EXTENDED MOTION STOPS

(71) Applicant: NXP USA, Inc., Austin, TX (US)

(72) Inventors: Andrew C McNeil, Chandler, AZ (US); Fengyuan Li, Gilbert, AZ (US)

(73) Assignee: NXP USA, Inc., Austin, TX (US)

(\*) Notice: Subject to any disclaimer, the term of this patent is extended or adjusted under 35 U.S.C. 154(b) by 6 days.

(21) Appl. No.: 16/904,182

(22) Filed: Jun. 17, 2020

(65) Prior Publication Data

US 2021/0396781 A1 Dec. 23, 2021

(51) Int. Cl.
*G01P 15/125* (2006.01)
*B81B 3/00* (2006.01)
*G01P 15/08* (2006.01)

(52) U.S. Cl.
CPC .......... *G01P 15/125* (2013.01); *B81B 3/0018* (2013.01); *B81B 3/0051* (2013.01); *B81B 2201/0228* (2013.01); *G01P 2015/0871* (2013.01)

(58) Field of Classification Search
CPC ........ G01P 15/125; G01P 15/18; G01P 15/08; G01P 15/0802; B81B 3/0051; B81B 3/0018
See application file for complete search history.

(56) References Cited

U.S. PATENT DOCUMENTS

| 8,539,836 | B2 | 9/2013 | McNeil | |
|---|---|---|---|---|
| 2006/0169043 | A1* | 8/2006 | McNeil | G01P 15/125 73/514.01 |
| 2008/0173959 | A1* | 7/2008 | Merassi | B81B 3/0051 257/415 |
| 2009/0031809 | A1* | 2/2009 | Lin | G01P 15/125 73/514.32 |
| 2009/0107238 | A1* | 4/2009 | Guo | G01P 15/0802 73/514.32 |
| 2010/0186508 | A1* | 7/2010 | Guenther | G01P 15/125 73/504.14 |
| 2011/0048131 | A1* | 3/2011 | Reinmuth | G01P 15/125 73/504.12 |
| 2011/0056297 | A1* | 3/2011 | Classen | G01P 15/125 73/514.32 |
| 2012/0186347 | A1* | 7/2012 | McNeil | G01P 15/125 73/514.32 |
| 2013/0047726 | A1* | 2/2013 | Lin | G01C 19/5712 73/504.12 |

(Continued)

*Primary Examiner* — Helen C Kwok

(57) ABSTRACT

A sensor includes a movable element adapted for rotational motion about a rotational axis due to acceleration along an axis perpendicular to a surface of a substrate. The movable element includes first and second ends, a first section having a first length between the rotational axis and the first end, and a second section having a second length between the rotational axis and the second end that is less than the first length. A motion stop extends from the second end of the second section. The first end of the first section includes a geometric stop region for contacting the surface of the substrate at a first distance away from the rotational axis. The motion stop for contacting the surface of the substrate at a second distance away from the rotational axis. The first and second distances facilitate symmetric stop performance between the geometric stop region and the motion stop.

12 Claims, 4 Drawing Sheets

(56) References Cited

U.S. PATENT DOCUMENTS

| | | | | |
|---|---|---|---|---|
| 2013/0192370 A1* | 8/2013 | Yoda | ............... | G01P 15/125 |
| | | | | 73/514.01 |
| 2014/0345380 A1* | 11/2014 | Jia | ............... | B81C 1/00968 |
| | | | | 73/514.32 |
| 2015/0053002 A1* | 2/2015 | Ullrich | ............... | G01P 15/125 |
| | | | | 73/514.15 |
| 2015/0233966 A1* | 8/2015 | Scheurle | ............... | G01P 15/125 |
| | | | | 73/514.32 |
| 2018/0252744 A1* | 9/2018 | Kamada | ............... | G01P 15/0802 |
| 2020/0241032 A1* | 7/2020 | Nagata | ............... | G01P 15/125 |

\* cited by examiner

Z-AXIS INERTIAL SENSOR WITH EXTENDED MOTION STOPS

TECHNICAL FIELD OF THE INVENTION

The present invention relates generally to inertial sensors. More specifically, the present invention relates to Z-axis inertial sensors in a teeter-totter configuration with enhanced response symmetry.

BACKGROUND OF THE INVENTION

Microelectromechanical Systems (MEMS) sensors are widely used in applications such as automotive, inertial guidance systems, household appliances, protection systems for a variety of devices, and many other industrial, scientific, and engineering systems. Such MEMS sensors are used to sense a physical condition such as acceleration, pressure, or temperature, and to provide an electrical signal representative of the sensed physical condition information.

Capacitive-sensing MEMS designs are highly desirable for operation in high acceleration environments and in miniaturized devices, due to their small size and suitability for low cost mass production. Capacitive accelerometers sense a change in electrical capacitance, with respect to acceleration, to vary the output of an energized circuit. One common form of an accelerometer is a two layer capacitive transducer having a "teeter-totter" or "see saw" configuration. This commonly utilized transducer type uses a movable element or plate that rotates under z-axis acceleration above a substrate. The accelerometer structure can measure two distinct capacitances to determine differential or relative capacitance.

SUMMARY

Aspects of the disclosure are defined in the accompanying claims.

In a first aspect, there is provided sensor comprising a substrate, and a movable element positioned in spaced apart relationship away from a surface of the substrate, the movable element being adapted for rotational motion in response to acceleration along an axis perpendicular to the surface of the substrate, the rotational motion occurring about a rotational axis positioned between first and second ends of the movable element, the movable element including a first section between the rotational axis and the first end, the first section being characterized by a first length, and the first end of the first section including a geometric stop region configured to contact the surface of the substrate at a first distance away from the rotational axis; a second section between the rotational axis and the second end, the second section being characterized by a second length that is less than the first length; and a motion stop extending from the second end of the second section, the motion stop configured to contact the surface of the substrate at a second distance away from the rotational axis, wherein the first and second distances are defined to yield substantially symmetric stop performance between the geometric stop region and the motion stop.

In a second aspect, there is provided sensor comprising a substrate and a first movable element positioned in spaced apart relationship away from a surface of the substrate, the first movable element being adapted for rotational motion about a first rotational axis positioned between first and second ends of the first movable element. The first movable element includes a first section between the first rotational axis and the first end, the first section being characterized by a first length, and the first end of the first section including a first geometric stop region configured to contact the surface of the substrate at a first distance away from the first rotational axis, a second section between the first rotational axis and the second end, the second section being characterized by a second length that is less than the first length; and a first motion stop extending from the second end of the second section, the first motion stop configured to contact the surface of the substrate at a second distance away from the first rotational axis, wherein the first and second distances are defined to yield substantially symmetric stop performance between the first geometric stop region and the first motion stop. The inertial sensor further comprises a second movable element positioned in spaced apart relationship away from the surface of the substrate, the second movable element being adapted for rotational motion about a second rotational axis positioned between third and fourth ends of the second movable element, wherein the second movable element is oriented in rotational symmetry relative to the first movable element about a point location on the surface of the substrate such that the first and second movable elements are disposed beside one another along a direction of a common rotational axis, and the first and second rotational axes extend along the common rotational axis. The second movable element includes a third section between the second rotational axis and the third end, the third section being characterized by a third length, and the third end of the third section including a second geometric stop region configured to contact the surface of the substrate at a third distance away from the second rotational axis; a fourth section between the second rotational axis and the fourth end, the fourth section being characterized by a fourth length that is less than the third length; and a second motion stop extending from the fourth end of the fourth section, the second motion stop configured to contact the surface of the substrate at a fourth distance away from the second rotational axis, wherein each of the first and second motion stops is characterized by an equivalent stop length, and the third and fourth distances are defined to yield the substantially symmetric stop performance between the second geometric stop region and the second motion stop.

In a third aspect, there is provided sensor comprising a substrate and a movable element positioned in spaced apart relationship away from a surface of the substrate, the movable element being adapted for rotational motion in response to acceleration along an axis perpendicular to the surface of the substrate, the rotational motion occurring about a rotational axis positioned between first and second ends of the movable element, the movable element including a first section between the rotational axis and the first end, the first section being characterized by a first length, and the first end of the first section including a geometric stop region configured to contact the surface of the substrate at a first distance away from the rotational axis; a second section between the rotational axis and the second end, the second section being characterized by a second length that is less than the first length; and a motion stop extending from the second end of the second section, each of the first and second sections and the motion stop exhibiting the same thickness in a direction that is perpendicular to the surface of the substrate, the motion stop being characterized by a stop length, the second length of the second section summed with the stop length being at least eighty percent of the first length of the first section, and the motion stop being configured to contact the surface of the substrate at a second distance away from the rotational axis.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, the present disclosure concerns inertial sensors having one or more movable elements (i.e., proof masses) suspended above an underlying substrate. An inertial sensor is constructed as a "teeter-totter" type sensor with a movable element having a shorter light-end and a relatively longer heavy-end. One or more motion stops extend from the light-end of the movable element at a distance that causes the light-end stop location to be similar to the heavy-end stop location. Such a configuration may provide a more symmetric response for teeter-totter sensor configurations and may reduce performance issues related to the light-end of the movable element. In additional aspects, some embodiments may include dual movable elements, having the extended motion stops, with the dual movable masses being oriented to minimize measurement errors due to thermally induced stress. Further, the dual movable elements may be shaped to optimize substrate area by allowing the dual movable elements to fit together in a nested configuration. Thus, such an inertial sensor achieves design objective of a mechanically robust design, symmetric response, compact size, and cost effective manufacturing.

The instant disclosure is provided to further explain in an enabling fashion at least one embodiment in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

Figure 1:
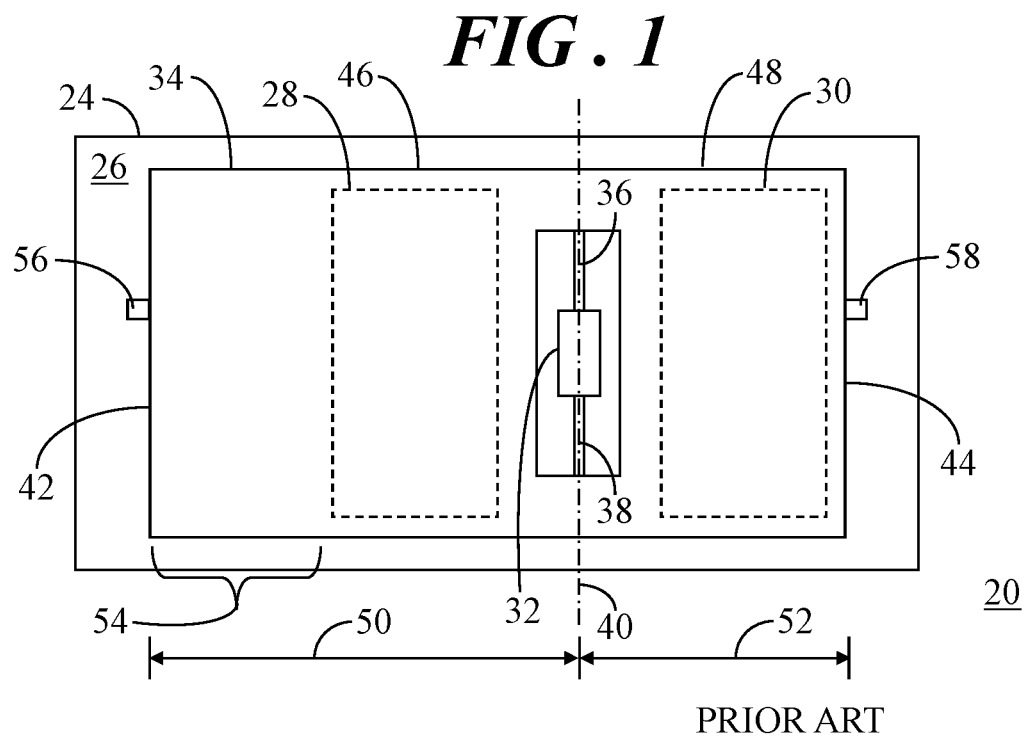
FIG. 1 shows a top view of a prior art inertial sensor.

Referring to FIG. 1, FIG. 1 shows a top view of a prior art inertial sensor 20. Inertial sensor 20, in the form of an accelerometer, is adapted to sense Z-axis acceleration, represented by an arrow 22 (see FIG. 2), and is constructed as a "teeter-totter" type sensor. Inertial sensor 20 includes a substrate 24 having a generally planar surface 26. A first sense element 28 and a second sense element 30 (represented by dashed lines in FIG. 1) are formed on surface 26 of substrate 24. In addition, a suspension anchor 32 is formed on surface 26 of substrate 24. A movable element, referred to herein as a proof mass 34, is positioned in spaced apart relationship above surface 26 of substrate 24. First and second compliant members 36, 38 interconnect proof mass 34 with suspension anchor 32 so that proof mass 34 is suspended above substrate 24.

Proof mass 34 is adapted for rotational motion in response to acceleration 22 along an axis perpendicular to surface 26 of substrate 24, thus changing its position relative to the underlying first and second sense elements 28, 30. This rotational motion occurs about a rotational axis 40 positioned between a first end 42 and a second end 44 of proof mass 34. In order to operate as a teeter-totter type accelerometer, a first section 46 of proof mass 34 on one side of rotational axis 40 is formed with relatively greater mass than a second section 48 on the other side of rotational axis 40. The greater mass of first section 46 may be created by offsetting rotational axis 40 such that a first length 50 of first section 46 between rotational axis 40 and first end 42 of proof mass 34 is greater than a second length 52 of second section 48 between rotational axis 40 and second end 44 of proof mass 34.

First and second sense elements 28, 30 are symmetrically arranged relative to rotational axis 40. That is, first and second sense elements 28, 30 are positioned equidistant from rotational axis 40. The area of first section 46 beyond first sense element 28 to first end 42 is referred to herein as an asymmetric portion 54 of proof mass 34. The presence of asymmetric portion 54 results in the greater mass of first section 46 relative to second section 48. For simplicity, first section 46 of proof mass 34 having the greater mass will be referred to hereinafter has heavy-end 46 and second section 48 will thus be referred to hereinafter as light-end 48.

Inertial sensor 20 further includes one or more motion stops 56 (one shown) extending from heavy-end 46 and one or more motion stops 58 (one shown) extending from light-end 48). For simplicity, motion stop 56 is referred to herein as heavy-end motion stop 56 and motion stop 58 is referred to herein as light-end motion stop 58. Due to the differing first and second lengths 50, 52 of heavy-end 46 and light-end 48, heavy-end and light-end motion stops 56, 58, respectively, are at different distances away from rotational axis 40. This asymmetric distance can cause various problems, discussed below.

Figure 2:
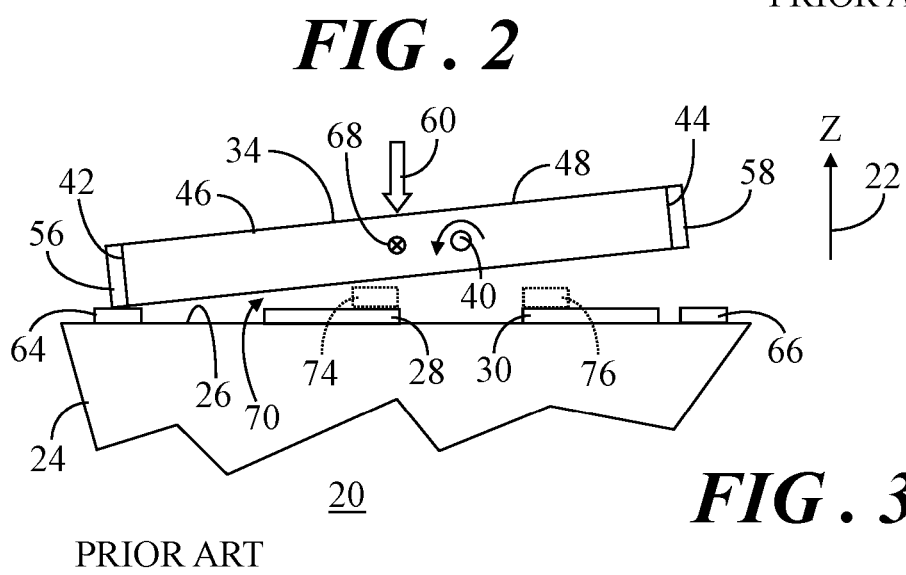
FIG. 2 shows a side view of the prior art inertial sensor undergoing motion due to a positive shock stimulus.
Figure 3:
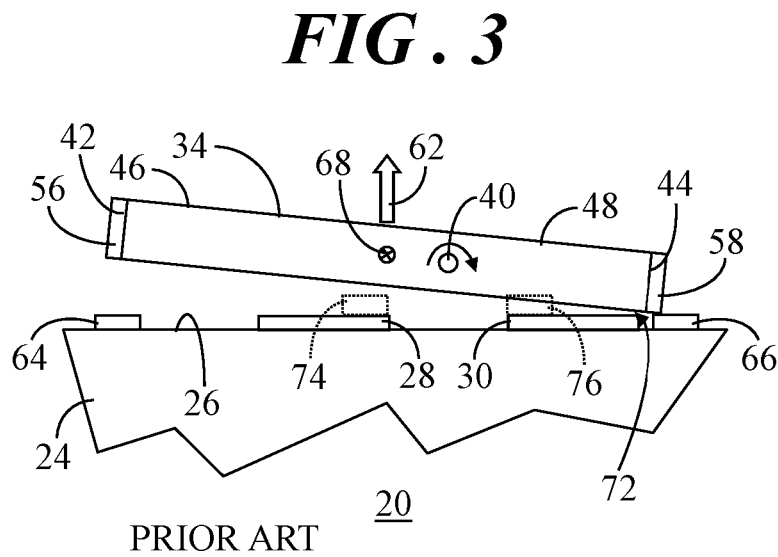
FIG. 3 shows a side view of the prior art inertial sensor undergoing motion due to a negative shock stimulus

Referring now to FIGS. 2 and 3 in connection with FIG. 1, FIG. 2 shows a side view of prior art inertial sensor 20 undergoing motion due to a positive shock stimulus 60 and FIG. 3 shows a side view of prior art inertial sensor 20 undergoing motion due to a negative shock stimulus 62. First and/or second shock stimulus 60, 62 may be in excess of 20,000 g's. Such a stimulus can produce mechanical breakage in inertial sensor 20 or stiction (e.g., permanent or temporary adhesion of proof mass 34 to substrate 24).

Under either of positive or negative shock stimulus 60, 62, either of heavy-end or light-end motion stops 56, 58 may hit a corresponding stop pad 64, 66 formed on surface 26 of substrate 24. More particularly, under positive shock stimulus 60, heavy-end motion stop 56 contacts stop pad 64 (FIG. 2) and under negative shock stimulus 62, light-end motion stop 58 contacts stop pad 66 (FIG. 3). Or, when stop pads 64, 66 are not present either of heavy-end or light end-motion stops 56, 58 may contact the underlying surface 26 of substrate 24. Due to a location 68 of the center of gravity of proof mass 34 and the asymmetric distance of motion stops 56, 58 from rotational axis 40, negative shock stimulus 62 may cause more stress in the torsional suspension (e.g., first and second compliant members 36, 38) than positive shock stimulus 60. This situation results because light-end motion stop 58 is closer to rotational axis 40. In some prior art designs, negative shock stimulus 62 can result in about twice the stress on the torsional suspension than positive shock stimulus 60. Thus, negative shock stimulus 62 may be more likely to cause mechanical breakage in inertial sensor 20 than positive shock stimulus 60.

In some manufacturing test scenarios, proof mass 34 may be pulled into pads 64, 66. When heavy-end motion stop 56 of heavy-end 46 is pulled into contact with pad 64, a first gap 70 (see FIG. 2) is produced between first sense element 28 and heavy-end 46 of proof mass 34. Similarly, when light-end motion stop 58 of light-end 48 is pulled into contact with pad 66, a second gap 72 (see FIG. 3) between second sense element 30 and light-end 48 is produced. Second gap 72 is smaller than first gap 70 thus yielding a higher final electrostatic force. That is, since light-end motion stop 58 is closer to rotational axis 40 than heavy-end motion stop 56, a greater electrostatic force is produced on pad 66 than on pad 64. This greater electrostatic force can cause a significant adhesion force. Accordingly, light-end motion stop 58 is significantly more likely to stick (as an artifact of the applied electrostatic force application) to pad 66 during unit testing than motion stop 56 is to pad 64.

Still further, some applications call for a symmetric dynamic response. For a prior art teeter-totter design (e.g., inertial sensor 20) there may be an asymmetric mechanical clipping which can result in measurement error. Still further applications may utilize a smaller gap near rotational axis 40. This is demonstrated in FIGS. 2 and 3 by raised portions 74, 76 (represented by dotted line boxes) of first and second sense elements 28, 30 that extend toward proof mass 34. As such, two gap sizes may be formed between proof mass 34 and first and second sense elements 28, 30. This may be referred to as a "bi-gap" technique. Such a technique may provide higher sensitivity and a better TCO (thermal coefficient of offset) value at the same die size than a technique that does not employ "bi-gap." Unfortunately, light-end 48 may be more likely to contact raised portion 76 of second sense electrode 30, thereby hindering the implementation of a "bi-gap" technique in some designs.

Embodiments described below may provide a more symmetric response for teeter-totter sensor configurations and may reduce the aforementioned performance issues related to the light-end of the movable element to yield a mechanically robust design, symmetric response, compact size, and cost effective manufacturing.

Figure 4:
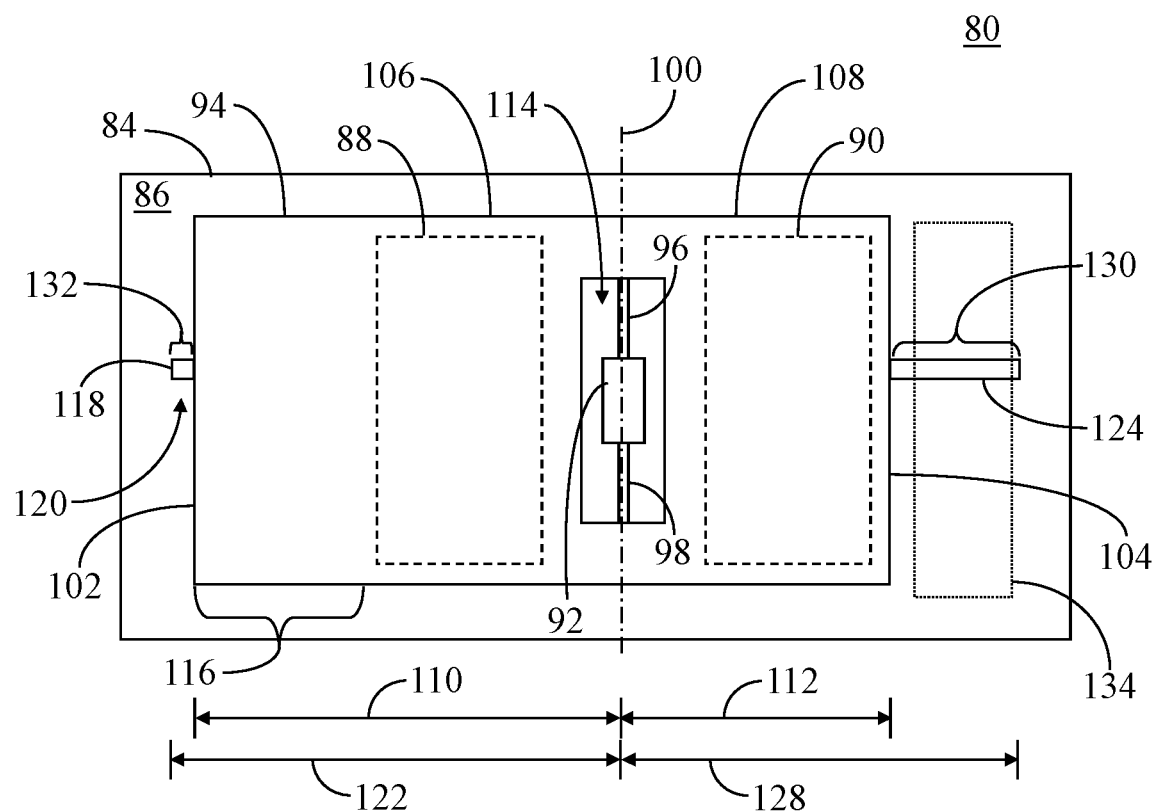
FIG. 4 shows a top view of an inertial sensor in accordance with an embodiment.
Figure 5:
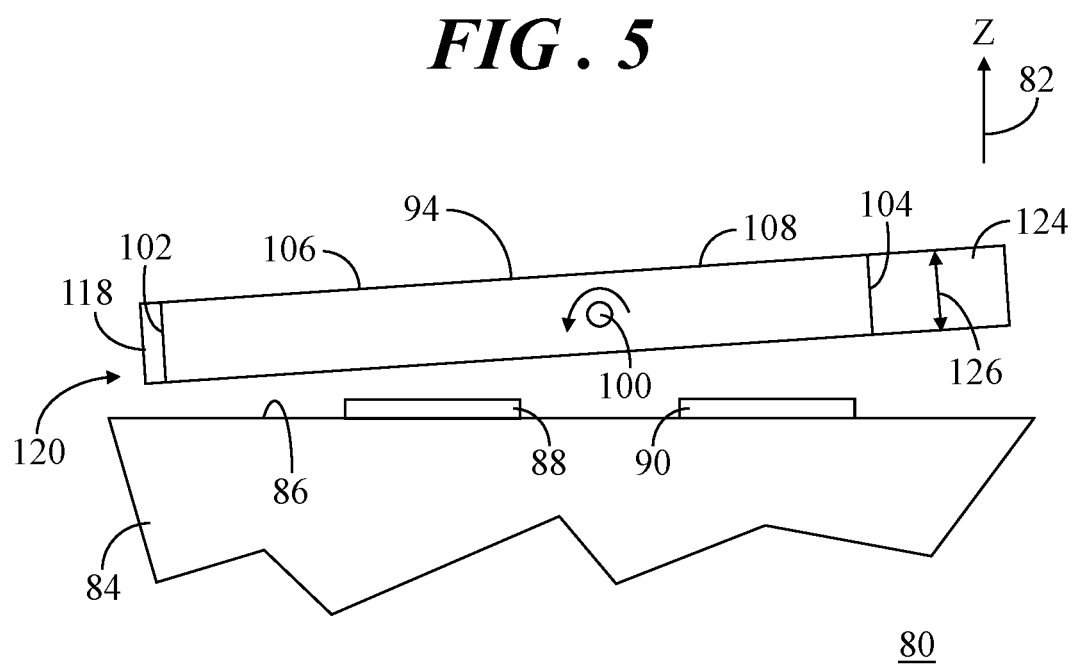
FIG. 5 shows a side view of the inertial sensor of FIG. 4.

Referring now to FIGS. 4-5, FIG. 4 shows a top view of an inertial sensor 80 in accordance with an embodiment and FIG. 5 shows a side view of inertial sensor 80. Inertial sensor 80, in the form of an accelerometer, is adapted to sense Z-axis acceleration, represented by an arrow 82, and is constructed as a "teeter-totter" type sensor. Inertial sensor 80 includes a substrate 84 having a generally planar surface 86. A first sense element 88 and a second sense element 90 (represented by dashed lines in FIG. 4) are formed on surface 86 of substrate 84. In addition, a suspension anchor 92 is formed on surface 86 of substrate 84. A movable element, referred to herein as a proof mass 94, is positioned in spaced apart relationship above surface 86 of substrate 84. First and second compliant members 96, 98 interconnect proof mass 94 with suspension anchor 92 so that proof mass 94 is suspended above substrate 84.

Proof mass 94 is adapted for rotational motion in response to acceleration 82 along an axis perpendicular to surface 86 of substrate 84, thus changing its position relative to the underlying first and second sense elements 88, 90. This rotational motion occurs about a rotational axis 100 positioned between a first end 102 and a second end 104 of proof mass 94. In order to operate as a teeter-totter type accelerometer, a first section 106 of proof mass 94 on one side of rotational axis 100 is formed with relatively greater mass than a second section 108 on the other side of rotational axis 100. The greater mass of first section 106 may be created by offsetting rotational axis 100 such that a first length 110 of first section 106 between rotational axis 100 and first end 102 of proof mass 94 is greater than a second length 112 of second section 108 between rotational axis 100 and second end 104 of proof mass 94.

As shown, an opening 114 extends through proof mass 94, and first and second compliant members 96, 98 are positioned at an approximate center of opening 114 along rotational axis 100. First and second sense elements 88, 90 are symmetrically arranged relative to rotational axis 100. That is, first and second sense elements 88, 90 are positioned equidistant from rotational axis 100. A region of first section 106 beyond first sense element 88 to first end 102 is referred to herein as an asymmetric portion 116 of proof mass 94. The presence of asymmetric portion 116 results in the greater mass of first section 106 relative to second section 108.

In some embodiments, inertial sensor 80 may include one or more motion stops 118 (one shown) extending from first end 102 of the first section 106. Motion stop 118 defines a geometric stop region 120 of first section 106. Other embodiments may not include motion stop 118 extending from first section 106. In such a configuration, first end 102 of proof mass 94 would serve as geometric stop region 120 of first section 106. Geometric stop region 120 is configured to contact surface 86 of substrate 84 at a first distance 122 away from rotational axis 100.

Inertial sensor 80 further includes one or more motion stops 124 (one shown) extending from second end 104 of second section 108 of proof mass 94. The elements of proof mass 94, including first and second sections 106, 108 and motion stops 118, 124, may be formed of the same material during a single deposition and etch process for simplified manufacturability relative some prior art designs in which the motion stops are thinner than the remainder of the proof mass. Consequently, first and second sections 106, 108 and motion stops 118, 124 exhibit the same thickness 126 (see FIG. 5) perpendicular to surface 86 of substrate 84. Although only a single motion stop 124 is shown, it should be understood that inertial sensor 80 may include multiple motion stops 124 arranged along and extending from second end 104 of second section 108.

Motion stop 124 is configured to contact surface 86 of substrate 84 at a second distance 128 away from rotational axis 100. In general, first and second distances 122, 128 are defined to yield substantially symmetric stop performance between geometric stop region 120 and motion stop 124. More particularly, motion stop 124 is lengthened relative to prior art designs in which motion stops on opposing ends of the proof mass are the same length. Accordingly, motion stop 124 is characterized by a first stop length 130 and motion stop 118 is characterized by a second stop length 132 that is less than first stop length 130. In some embodiments, second length 112 of second section summed with first stop length 130 of motion stop 124 is at least eighty percent of first length 110 of first section 106. Thus, second distance 128 at which motion stop 124 contacts surface 86 of substrate 84 may be within twenty-five percent of first distance 122 at which geometric stop region 120 contacts surface 86 of substrate 84. By making second distance 128 similar to first distance 122, a more symmetric stop performance can be achieved to reduce the aforementioned problems associated with the light-end (e.g., second section 108) of the proof mass in prior art designs (e.g., proof mass 34 of FIGS. 1-3) including excessive contact force, stress on the suspension elements, stiction, and so forth.

A single teeter-totter configuration, such as that shown in FIGS. 4-5, may be useful for certain applications. However, other applications may call for higher sensitivity, enhanced accuracy by minimizing measurement errors due to thermally induced stress, and/or optimized substrate area. A dotted line rectangle 134 demonstrates unused area of substrate 84 allocated for the presence of the elongated motion stop 124. An inertial sensor configuration described in connection with FIGS. 6-7 may be implemented to improve sensitivity and to minimize measurement errors. Further, an inertial sensor configuration described below in connection with FIG. 8 may be implemented to improve sensitivity, to minimize measurement errors due to thermally induced stress, and to additionally optimize substrate area.

Figure 6:
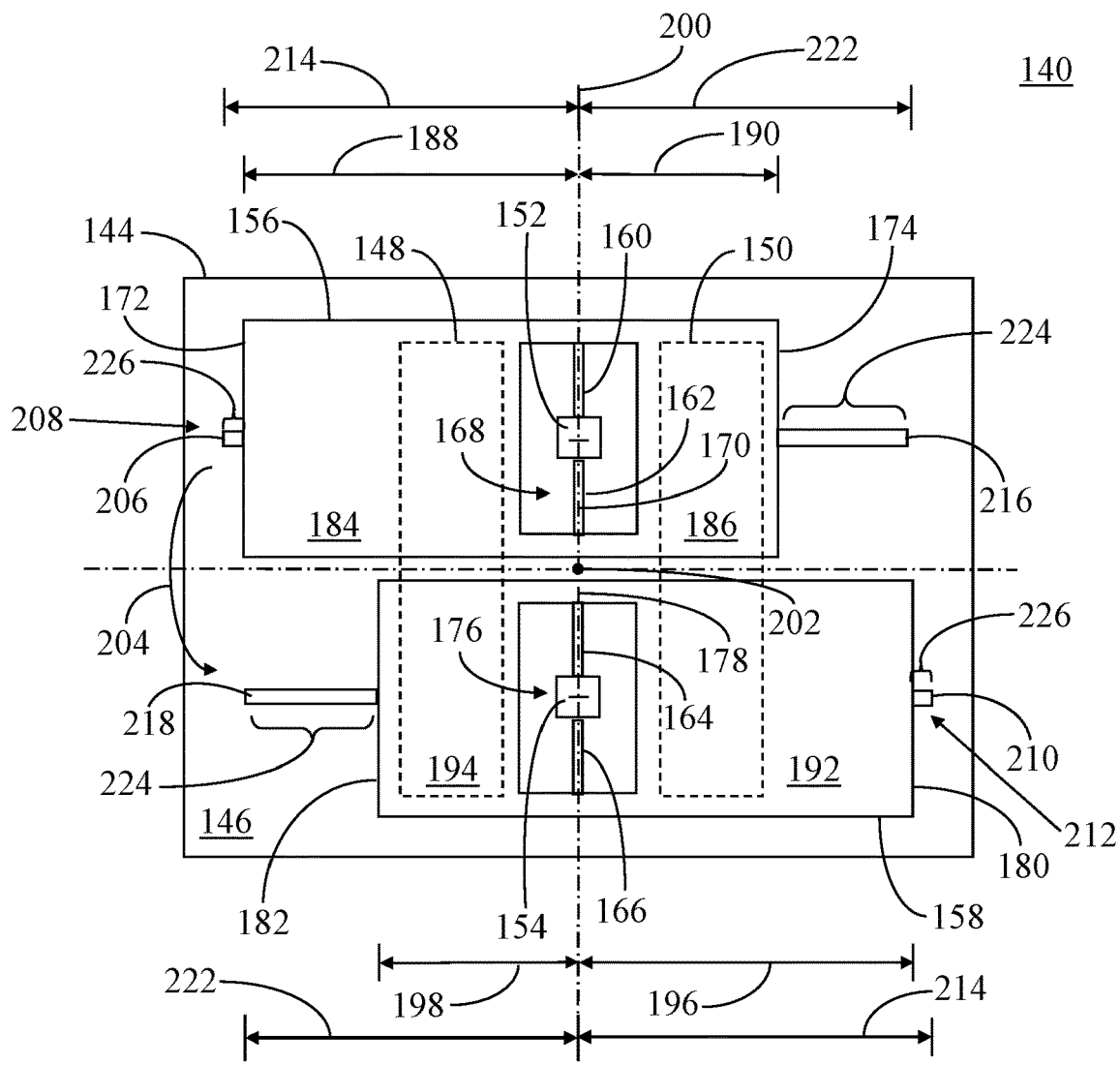
FIG. 6 shows a top view of an inertial sensor in accordance with another embodiment.
Figure 7:
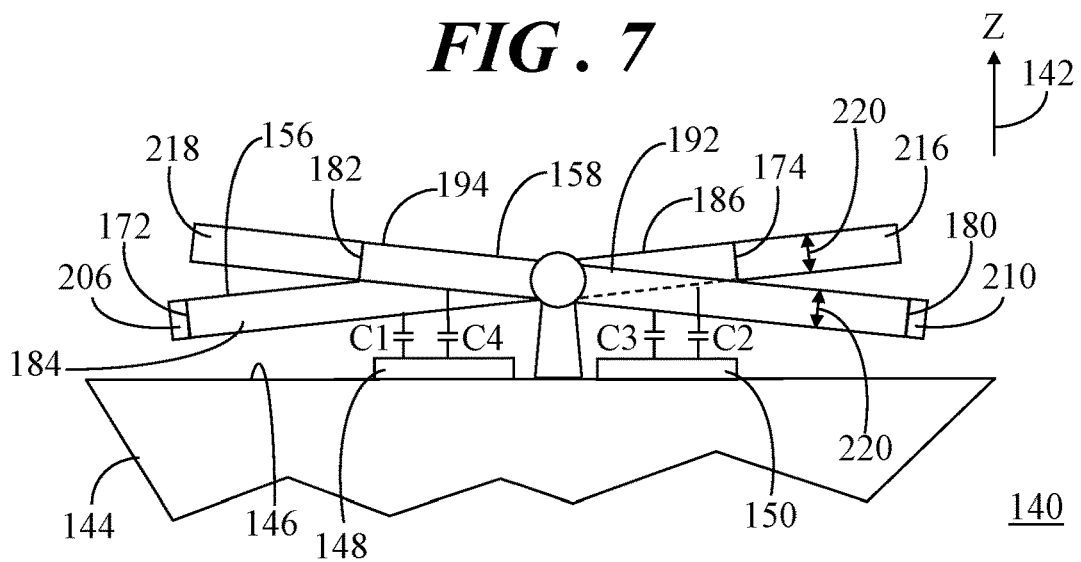
FIG. 7 shows a side view of the inertial sensor of FIG. 6.

Referring to FIGS. 6-7, FIG. 6 shows a top view of an inertial sensor 140 in accordance with another embodiment and FIG. 7 shows a side view of inertial sensor 140. Inertial sensor 140, in the form of an accelerometer, is adapted to sense z-axis acceleration, represented by an arrow 142, and is constructed as a "teeter-totter" type sensor. Inertial sensor 140 includes a substrate 144 having a generally planar surface 146. A first sense element 148 and a second sense element 150 (represented by dashed lines in FIG. 6) are formed on surface 146 of substrate 144. In addition, a first suspension anchor 152 and a second suspension anchor 154 are formed on surface 146 of substrate 144. A first movable element, referred to herein as a first proof mass 156, and a second movable element, referred to herein as a second proof mass 158, are positioned in spaced apart relationship above surface 146 of substrate 144.

Inertial sensor 140 further includes a first and second compliant members 160, 162 interconnecting first proof mass 156 with first suspension anchor 152 so that first proof mass 156 is suspended above substrate 144. Similarly, inertial sensor 140 includes third and fourth compliant members 164, 166 interconnecting second proof mass 158 with second suspension anchor 154 so that second proof mass 158 is also suspended above substrate 144.

As shown, an opening 168 extends through first proof mass 156 and first suspension anchor 152 is positioned at an approximate center of opening 168 along a first rotational axis 170 of first proof mass 156 between first and second ends 172, 174 of first proof mass 156. Likewise, an opening 176 extends through second proof mass 158 and second suspension anchor 154 is positioned at an approximate center of opening 176 along a second rotational axis 178 of second proof mass 158 between third and fourth ends 180, 182 of second proof mass 158.

In order to operate as a teeter-totter type accelerometer, a first section 184 of first proof mass 156 on one side of first rotational axis 170 is formed with relatively greater mass than a second section 186 of first proof mass 156 on the other side of first rotational axis 170. In an example embodiment, the greater mass of first section 184 may be created by offsetting first rotational axis 170 such that a first length 188 of first section 184 between first rotational axis 170 and first end 172 is greater than a second length 190 of second section 186 between first rotational axis 170 and second end 174. Similarly, a third section 192 of second proof mass 158 on one side of second rotational axis 178 is formed with relatively greater mass than a fourth section 194 of second proof mass 158 on the other side of second rotational axis 178. The greater mass of third section 192 may be created by offsetting second rotational axis 178 such that a third length 196 of third section 192 between second rotational axis 178 and third end 180 is greater than a fourth length 198 of fourth section 194 between second rotational axis 178 and fourth end 182. Each of first and second proof masses 156, 158 is adapted for rotation about its corresponding one of first and second rotational axes 170, 178 in response to z-axis acceleration 142 perpendicular to surface 146 of substrate 144, thus changing its position relative to the underlying first and second sense elements 148, 150.

First and second proof masses 156, 158 have a substantially equivalent (i.e., the same) shape and size. In the illustrated embodiment of FIGS. 6-7, the shape is generally rectangular. Additionally, first length 188 of first section 184 is substantially equivalent to third length 196 of third section 192, and second length 190 of second section 186 is substantially equivalent to fourth length 198 of fourth section 194. It should also be observed that first and second rotational axes 170, 178 are aligned with one another along a common axis of rotation 200.

Some inertial sensor applications call for lower temperature coefficient of offset (TCO) specifications. TCO is a measure of how much thermal stresses affect the performance of a semiconductor device, such as an inertial sensor. A high TCO indicates correspondingly high thermally induced stress, or a device that is very sensitive to such a stress. The packaging of sensor applications often uses materials with dissimilar coefficients of thermal expansion. Thus, an undesirably high TCO can develop during manufacture or operation. In addition, stresses can result from soldering the packaged semiconductor device onto a printed circuit board in an end application. The combination of stresses and the material properties of the device can result in strain, i.e., deformation, in substrate 144. First and second suspension anchors 152, 154 can also experience this strain, or deformation, via the underlying substrate 144. The strain in suspension anchors 152, 154 can cause some rotation of first and second proof masses 156, 158 about their respective first and second rotational axes 170, 178 resulting in measurement inaccuracies, thus adversely affecting the output of capacitive inertial sensor 140.

Consequently, first and second proof masses 156, 158 are not arranged in accordance with reflection symmetry. Rather, second proof mass 158 is generally oriented in rotational symmetry relative to first proof mass 156 about a point location 202 on surface 146 of substrate 144 in order to counteract the problem of strain at first and second suspension anchors 152, 154 causing measurement inaccuracies. The term "rotational symmetry" utilized herein refers to an arrangement in which second proof mass 158 is rotated about point location 202 relative to first proof mass 156, but "still looks the same" as first proof mass 156. That is, every point on first proof mass 156 has a matching point on second proof mass 158 that is the same distance from point location 202, but in the opposite direction. This rotational symmetry is represented in FIG. 6 by an arrow 204. In some embodiments, second proof mass 158 is located in an orientation that is rotated about point location 202 on substrate 144 approximately one hundred and eighty degrees relative to first proof mass 156. This configuration of rotational symmetry is sometimes referred to as "second degree rotational symmetry."

Accordingly, it is the rotationally symmetric arrangement of first and second proof masses 156, 158, respectively, that results in first and second axes of rotation 170, 178, respectively, being aligned with one another along common axis of rotation 200. Thus, any strain experienced through first suspension anchor 152 causing rotation of first proof mass 156 is balanced by a generally equal and opposite strain experienced through second suspension anchor 154 causing rotation of second proof mass 158. In addition, the rotationally symmetric arrangement of first and second proof masses 156, 158 enables close placement of sense elements 148, 150 to one another. This close proximity results in sense element 148, 150 having similar deformation due to strain.

FIG. 7 represents the rotation of first and second proof masses 156, 158 about common axis of rotation 200. In response to Z-axis acceleration 142, first proof mass 156 rotates in a first direction and second proof mass 158 rotates in a second direction. However, the second direction of rotation of second proof mass 158 is opposite the first direction of rotation of first proof mass 156 due to the rotational symmetry of first and second proof masses 156, 158.

As first and second proof masses rotate 156, 158 rotate, their positions change relative to the underlying sense elements 148, 150. This change in position results in a set of capacitances whose difference, i.e., a differential capacitance, is indicative of acceleration 142. As shown in FIG. 7, a first capacitance, C1, is formed between first section 184 of first proof mass 156 and first sense element 148. A second capacitance, C2, is formed between second section 186 of first proof mass 156 and second sense element 150. Additionally, a third capacitance, C3, is formed between third section 192 of second proof mass 158 and second sense element 150. And, a fourth capacitance, C4, is formed between fourth section 194 of second proof mass 158 and first sense element 148.

An acceleration output can be characterized as ACCEL (OUT) α (C1+C3)−(C2+C4), in which the acceleration output, ACCEL(OUT), is proportional to the difference between the sum of first and third capacitances (C1 and C3) and the sum of second and fourth capacitances (C2 and C4). The dual proof mass configuration of inertial sensor 140 may thus yield a relatively high acceleration output in a small package that may be well suited for low cost mass production. Furthermore, the rotationally symmetric configuration of first and second proof masses 156, 158 may also result in at least partial cancellation of measurement error due to thermally induced stress, also known as TCO.

In some embodiments, inertial sensor 140 may include one or more motion stops, referred to herein as first heavy-end motion stops 206 (one shown), extending from first end 172 of first section 184 of first proof mass 156. Motion stop 206 defines a first geometric stop region 208 of first section 184 of first proof mass 156. Similarly, inertial sensor 140 may include one or more motion stops, referred to herein as second heavy-end motion stops 210 (one shown), extending from third end 180 of third section 192 of second proof mass 158. Motion stop 210 defines a second geometric stop region 212 of third section 192 of second proof mass 158. Other embodiments may not include motion stops 206, 210 extending from respective first and third sections 184, 192. In such a configuration, first end 172 of first proof mass 156 would serve as first geometric stop region 208 and third end 180 of second proof mass 158 would serve as second geometric stop region 212. First geometric stop region 208 is configured to contact surface 146 of substrate 144 at a first distance 214 away from first rotational axis 170. Likewise, second geometric stop region 210 is configured to contact surface 146 of substrate 144 at first distance 214 away from second rotational axis 178, but on the opposite side of common axis of rotation 200 in accordance with the rotational symmetry configuration of first and second proof masses 156, 158.

Inertial sensor 140 further includes one or more motion stops, referred to herein as first light-end motion stops 216 (one shown), extending from second end 174 of second section 186 of first proof mass 156. Similarly, inertial sensor 140 further includes one or more motion stops, referred to herein as second light-end motion stops 218 (one shown), extending from fourth end 182 of second proof mass 158. Similar to that discussed above, the elements of first and second proof masses 156, 158, including sections 184, 186, 192, 194 and motion stops 206, 210, 216, 218, may be formed of the same material during a single deposition and etch process for simplified manufacturability relative some prior art designs in which the motion stops are thinner than the remainder of the proof mass. Consequently, sections 184, 186, 192, 194 and motion stops 206, 210, 216, 218 exhibit the same thickness 220 (see FIG. 7) perpendicular to surface 146 of substrate 144. Although only a single motion stop at each end of the proof masses is shown, it should be understood that inertial sensor 140 may include multiple motion stops arranged along and extending from each end of the proof masses.

First light-end motion stop 216 is configured to contact surface 146 of substrate 144 at a second distance 222 away from first rotational axis 170. Likewise, second light-end motion stop 218 is configured to contact surface 146 of substrate 144 at second distance 222 away from second rotational axis 178, but on the opposite side of common axis of rotation 200 in accordance with the rotational symmetry configuration of first and second proof masses 156, 158.

Similar to that discussed above, first and second distances 214, 222 are defined to yield substantially symmetric stop performance between first and second geometric stop regions 208, 212 and corresponding first and second light-end motion stops 216, 218. More particularly, first and second light-end motion stops 216, 218 are lengthened relative to prior art designs in which motion stops on opposing ends of the proof mass are the same length. Accordingly, each of first and second light-end motion stops 216, 218 is characterized by a substantially equivalent first stop length 224 and each of first and second heavy-end motion stops 206, 210 is characterized by a substantially equivalent second stop length 226 that is less than first stop length 224.

In some embodiments, second length 190 of second section 186 of first proof mass 156 summed with first stop length 224 of first light-end motion stop 216 is at least eighty percent of first length 188 of first section 184 of first proof mass 156. Correspondingly, fourth length 198 of fourth section 194 of second proof mass 158 summed with first stop length 224 of second light-end motion stop 218 is at least eighty percent of first length 188 of third section 192 of second proof mass 158. Thus, second distance 222 at which each of first and second light-end motion stops 216, 218 contacts surface 146 of substrate 144 may be within twenty-five percent of first distance 214 at which each of first and second geometric stop regions 208, 212 contacts surface 146 of substrate 144. By making second distance 222 similar to or the same as first distance 214, a more symmetric stop performance may be achieved to reduce contact force, reduce stress on the suspension elements, reduce stiction, and for forth associated with the light-end of the dual proof mass, rotationally symmetric teeter-totter design.

Figure 8:
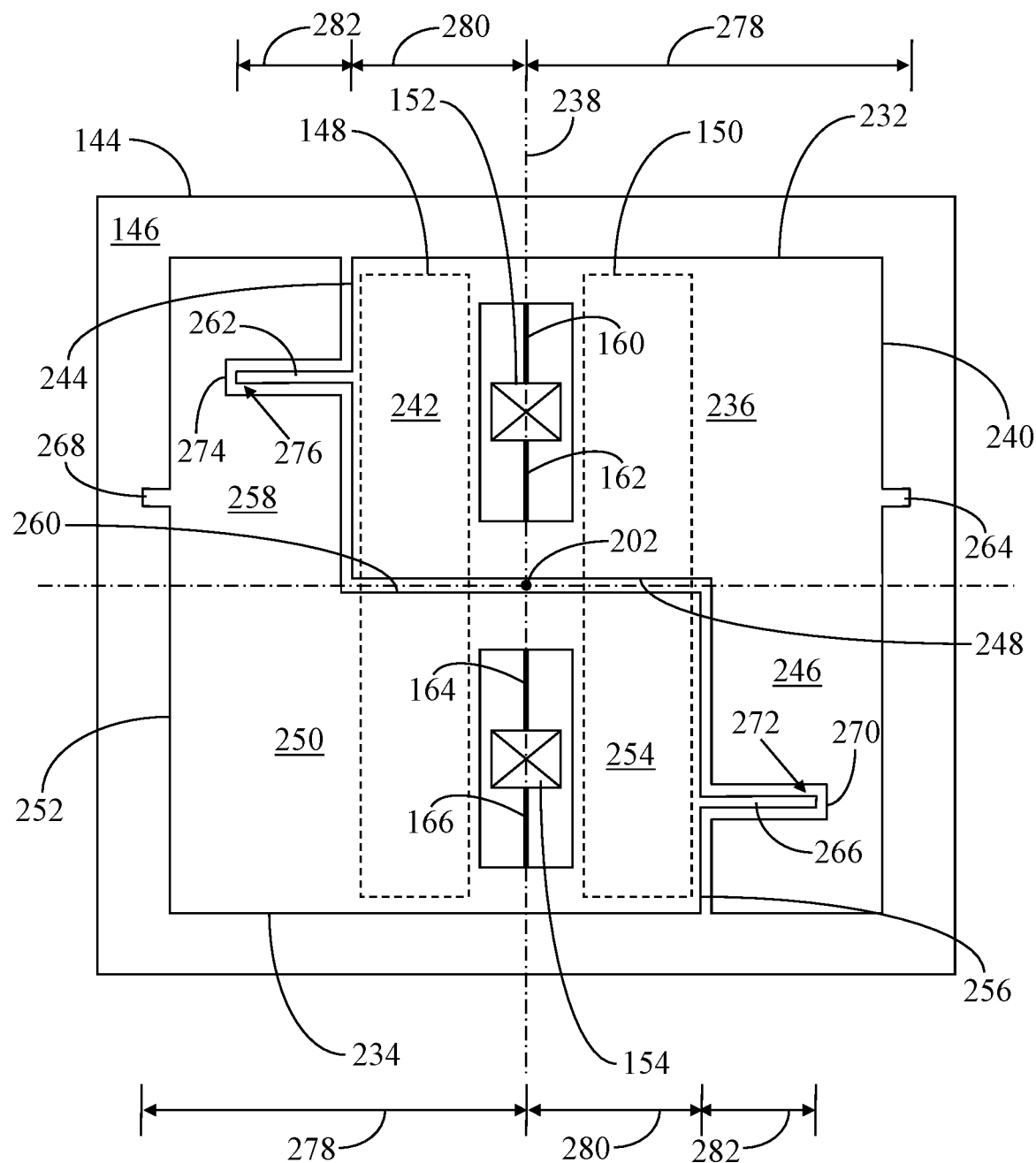
FIG. 8 shows a top view of an inertial sensor in accordance with yet another embodiment.

FIG. 8 shows a top view of an inertial sensor 230 in accordance with yet another embodiment. A brief review of inertial sensor 140 (FIG. 6) reveals that there are significant areas of unused space overlying substrate 144 due to the rotationally symmetric configuration of first and second proof masses 156, 158. In particular, a region overlying substrate 144 proximate second end 174 of first proof mass 156 and another region overlying substrate 144 proximate fourth end 182 of second proof mass 158 are unused. The configuration of inertial sensor 230 capitalizes on this unused spaced through a nested arrangement of L-shaped movable masses to achieve higher sensitivity of z-axis acceleration 142 while implementing the extended motion stops on the light end of the movable masses for a more symmetric stop performance.

Many components of inertial sensor 230 are generally equivalent to the components of inertial sensor 140 (FIGS. 6-7). For simplicity, the same reference numerals are used herein for the equivalent components. As such, inertial sensor 230 includes substrate 144, with first sense element 148, second sense element 150, first suspension anchor 152, and second suspension anchor 154 formed on surface 146 of substrate 144.

Inertial sensor 230 further includes a first movable element, referred to herein as a first proof mass 232, and a second movable element, referred to herein as a second proof mass 234, positioned in spaced apart relationship above surface 146 of substrate 144. First and second compliant members 160, 162 interconnect first proof mass 232 with first suspension anchor 152 so that first proof mass 232 is suspended above substrate 144. Likewise, third and a fourth compliant members 164, 166 interconnect second proof mass 234 with second suspension anchor 154 so that second proof mass 234 is suspended above substrate 144.

In contrast to the generally rectangular shape of first and second proof masses 156, 158 (FIGS. 6-7), first and second proof masses 232, 234 of inertial sensor 230 are L-shaped elements. That is, first proof mass 232 includes a first section 236 between a common rotational axis 238 and a first end 240 of first proof mass 232 and a second section 242 between common rotational axis 238 and a second end 244 of first proof mass 232. A first lateral extension section 246 extends from a first side 248 of first section 236 of first proof mass 232. Second proof mass 234 includes a third section 250 between common rotational axis 238 and a third end 252 of second proof mass 232 and a fourth section 254 between common rotational axis 238 and a fourth end 256 of second proof mass 234. A second lateral extension section 258 extends from a second side 260 of third section 250.

Second L-shaped proof mass 234 is generally oriented in rotational symmetry relative to first L-shaped proof mass 232 about point location 202 on surface 146 of substrate 144 to achieve a nested configuration in which first and second proof masses 232, 234 fit together without being in contact with one another. The formerly unused regions overlying substrate 144 are now utilized to further increase the mass of opposing first and third sections 236, 250 of first and second proof masses 232, 234. This increased mass can provide higher sensitivity to Z-axis acceleration 142 (FIG. 7) using the same area as inertial sensor 140 (FIGS. 6-7). In addition, the rotationally symmetric configuration of first and second proof masses 232, 234 may result in at least partial cancellation of measurement error due to thermally induced stress.

It can be observed in FIG. 8 that first proof mass 232 includes one or more first light-end motion stops 262 (one shown) extending from second end 244 of second section 242 and may optionally include one or more first heavy-end motion stops 264 (one shown) extending from first end 240 of first section 236. Likewise, second proof mass 234 includes one or more second light-end motion stops 266 (one shown) extending from fourth end 256 of fourth section 254 and may optionally include one or more second heavy-end motion stops 268 extending from third end 252 of third section 250. The description of first and second heavy-end motion stops 206, 210 presented above applies equivalently to first and second heavy-end motion stops 264, 268. Likewise, the description of first and second light-end motion stops 216, 218 presented above applies equivalently to first and second light-end motion stops 262, 266. Accordingly, a description of motion stops 262, 264, 266, 268 will not be repeated herein for brevity.

It can be observed in the illustrated embodiment, that first lateral extension section 246 includes a first notched section 270. Second light-end motion stop 266 resides in first notched section 270 and is spaced apart from first lateral extension section 246 by a first gap 272. Additionally, second lateral extension section 258 includes a second notched section 274. First light-end motion stop 262 resides in second notched section 274 and is spaced apart from second lateral extension section 258 by a second gap 276. Of course, the lateral extension sections 246, 258 can have multiple notched sections to correspond with a configuration having multiple light-end motion stops.

Each of first and third sections 236, 250 of corresponding first and second proof masses 232, 234 exhibit a first length 278, each of second and fourth sections 242, 254 exhibit a second length 280, and each of first and second light-end motion stops 262, 266 exhibit a stop length 282. In some embodiments, second length 280 of second section 242 of first proof mass 232 summed with stop length 282 of first light-end motion stop 262 is at least eighty percent of a first length 278 of first section 236 of first proof mass 232. Correspondingly, second length 280 of fourth section 254 of second proof mass 234 summed with stop length 282 of second light-end motion stop 266 is at least eighty percent of first length 278 of third section 250 of second proof mass 234. Thus, a distance at which each of first and second light-end motion stops 262, 266 contacts surface 146 of substrate 144 may be within twenty-five percent of a distance at which each of first and second heavy-end motion stops 264, 268 (or alternatively first and third ends 240, 252 of first and third sections 236, 250) contacts surface 146 of substrate 144. In this example, the distance at which each of first and second light-end motion stops 262, 266 contacts surface 146 of substrate 144 is slightly less than the distance at which each of first and second heavy-end motion stops 264, 268 contacts surface 146 of substrate 144 to maintain the structural integrity of first and second lateral extension sections 246, 258 while concurrently enabling a more symmetric stop performance to reduce contact force, reduce stress on the suspension elements, reduce stiction, and for forth associated with the light-end of the nested, dual proof mass, rotationally symmetric teeter-totter design.

Embodiments described herein entail inertial sensors having one or more movable elements (i.e., proof masses) suspended above an underlying substrate. An inertial sensor is constructed as a "teeter-totter" type sensor with a movable element having a shorter light-end and a relatively longer heavy-end. One or more motion stops extend from the light-end of the movable element at a distance that causes the light-end stop location to be similar to the heavy-end stop location. Such a configuration may provide a more symmetric response for teeter-totter sensor configurations and may reduce performance issues related to the light-end of the movable element. In additional aspects, some embodiments may include dual movable elements, with the extended motion stops, that are oriented to minimize measurement errors due to thermally induced stress. Further, the dual movable elements may be shaped to optimize substrate area by allowing the dual movable elements to fit together in a nested configuration. Thus, such an inertial sensor may achieve design objectives of a mechanically robust design, symmetric response, compact size, and cost effective manufacturing.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A sensor comprising:
   a substrate;
   a first movable element positioned in spaced apart relationship away from a surface of the substrate, the first movable element being adapted for rotational motion in a first direction in response to acceleration along an axis perpendicular to the surface of the substrate, the rotational motion occurring about a first rotational axis positioned between first and second ends of the first movable element, the first movable element including:
   a first section between the first rotational axis and the first end of the first movable element, the first section being characterized by a first length, a first end of the first section including a first geometric stop region configured to contact the surface of the substrate at a first distance away from the first rotational axis,
   a second section between the first rotational axis and the second end of the first movable element, the second section being characterized by a second length that is less than the first length,
   a first motion stop extending from a second end of the second section, wherein a first width of the first motion stop is less than a second width of the second section of the first movable element and the first motion stop is coplanar with the second section, the first motion stop is configured to contact the surface of the substrate at a second distance away from the first rotational axis, and wherein the first and second distances are defined to yield substantially symmetric stop performance between the first geometric stop region and the first motion stop, and
   a second movable element positioned in spaced apart relationship away from the surface of the substrate, the second movable element being adapted for rotational motion in a second direction in response to the acceleration, the rotational motion occurring about a second rotational axis positioned between third and fourth ends of the second movable element, the second direction being opposite to the first direction, the second movable element including:
   a third section between the second rotational axis and the third end of the second movable element, the third section being characterized by a third length, and a third end of the third section including a second geometric stop region configured to contact the surface of the substrate at a third distance away from the second rotational axis,
   a fourth section between the second rotational axis and the fourth end of the second movable element, the fourth section being characterized by a fourth length that is less than the third length, and
   a second motion stop extending from a fourth end of the fourth section, wherein a third width of the second motion stop is less than a fourth width of the fourth section of the second movable element, the second motion stop configured to contact the surface of the substrate at a fourth distance away from the second rotational axis, wherein the third and fourth distances are defined to yield the substantially symmetric stop performance between the second geometric stop region and the second motion stop;
   a first lateral extension section extending from a first side of the first section, the first lateral extension section being located proximate a fourth end of the second movable element, wherein the first lateral extension section includes a first notch sized to receive the second motion stop, wherein the first notch is defined by a first edge along a first notch length of the first notch and a second edge along the first notch length, the first edge being parallel and opposed to the second edge, the second motion stop residing in the first notch and spaced apart from the first edge of the first notch by a first gap distance and spaced apart from the second edge of the first notch by the first gap distance; and
   a second lateral extension section extending from a second side of the third section, the second lateral extension section being located proximate the second end of the first movable element, wherein the second lateral extension section includes a second notch sized to receive the first motion stop, wherein the second notch is defined by a third edge along a second notch length of the second notch and a fourth edge along the second notch length, the third edge being parallel and opposed to the fourth edge, the first motion stop residing in the second notch and spaced apart from the third edge of the second notch by a second gap distance and spaced apart from the fourth edge of the second notch by the second gap distance,
   wherein the first and second movable elements have a substantially equivalent shape and the second movable element is generally oriented in rotational symmetry relative to the first movable element about a point location on the surface of the substrate such that the first and second movable elements are disposed beside one another along a direction of a common rotational axis, and the first rotational axis and the second rotational axis each extend along the common rotational axis.

2. The sensor of claim 1 wherein the first motion stop is characterized by a stop length, and wherein the second length of the second section summed with the stop length of the first motion stop is at least eighty percent of the first length of the first section.

3. The sensor of claim 1 wherein the second distance at which the first motion stop contacts the surface is within twenty-five percent of the first distance at which the first geometric stop region contacts the surface.

4. The sensor of claim 1 wherein each of the first and second sections and the first motion stop exhibit the same thickness in a direction that is perpendicular to the surface of the substrate.

5. The sensor of claim 1 wherein:
the first motion stop is characterized by a first stop length; and
the sensor further comprises the second motion stop extending from the first end of the first section, the second motion stop defining the first geometric stop region, the second motion stop being characterized by a second length that is less than the first stop length.

6. The sensor of claim 1 wherein the first motion stop is characterized by a first stop length and the second motion stop is characterized by a second stop length that is substantially equivalent to the first stop length.

7. The sensor of claim 1 wherein:
the first length is substantially equivalent to the third length; and
the second length is substantially equivalent to the fourth length.

8. The sensor of claim 1 wherein the second movable element is located in an orientation that is rotated about the point location approximately one hundred eighty degrees relative to the first movable element.

9. The sensor of claim 1 wherein:
the first movable element including the first lateral extension section forms a first L-shaped movable element; and
the second movable element including the second lateral extension section forms a second L-shaped movable element, the first and second L-shaped movable elements being arranged in a nested configuration without contact between the first and second L-shaped movable elements.

10. A sensor comprising:
a substrate;
a first movable element positioned in spaced apart relationship away from a surface of the substrate, the first movable element being adapted for rotational motion about a first rotational axis positioned between first and second ends of the first movable element, the first movable element including:
a first section between the first rotational axis and the first end of the first movable element, the first section being characterized by a first length, a first end of the first section including a first geometric stop region configured to contact the surface of the substrate at a first distance away from the first rotational axis,
a second section between the first rotational axis and the second end of the first movable element, the second section being characterized by a second length that is less than the first length, and
a first motion stop extending from a second end of the second section, wherein a first width of the first motion stop is less than a second width of the second section of the first movable element and the first motion stop is coplanar with the second section, the first motion stop is configured to contact the surface of the substrate at a second distance away from the first rotational axis, and wherein the first and second distances are defined to yield substantially symmetric stop performance between the first geometric stop region and the first motion stop;
a second movable element positioned in spaced apart relationship away from the surface of the substrate, the second movable element being adapted for rotational motion about a second rotational axis positioned between third and fourth ends of the second movable element, wherein the second movable element is oriented in rotational symmetry relative to the first movable element about a point location on the surface of the substrate such that the first and second movable elements are disposed beside one another along a direction of a common rotational axis, and the first rotational axis and the second rotational axis extend along the common rotational axis, the second movable element including:
a third section between the second rotational axis and the third end of the second movable element, the third section being characterized by a third length, and a third end of the third section including a second geometric stop region configured to contact the surface of the substrate at a third distance away from the second rotational axis,
a fourth section between the second rotational axis and the fourth end of the second movable element, the fourth section being characterized by a fourth length that is less than the third length, and
a second motion stop extending from a fourth end of the fourth section, wherein a third width of the second motion stop is less than a fourth width of the fourth section of the second movable element and the second motion stop is coplanar with the fourth section, the second motion stop configured to contact the surface of the substrate at a fourth distance away from the second rotational axis, wherein each of the first and second motion stops is characterized by an equivalent stop length, and the third and fourth distances are defined to yield the substantially symmetric stop performance between the second geometric stop region and the second motion stop;
a first lateral extension section extending from a first side of the first section, the first lateral extension section being located proximate a fourth end of the second movable element, wherein the first lateral extension section includes a first notch, wherein the first notch is defined by a first edge along a first notch length of the first notch and a second edge along the first notch length, the first edge being parallel and opposed to the second edge, the second motion stop is spaced apart from the first edge of the first notch by a first gap distance and spaced apart from the second edge of the first notch by the first gap distance; and
a second lateral extension section extending from a second side of the third section, the second lateral extension section being located proximate the second end of the first movable element, wherein the second lateral extension section includes a second notch, wherein the second notch is defined by a third edge along a second notch length of the second notch and a fourth edge along the second notch length, the third edge being parallel and opposed to the fourth edge, the first motion stop residing in the second notch and spaced apart from the third edge of the second notch by a second gap distance and spaced apart from the fourth edge of the second notch by the second gap distance.

11. The sensor of claim 10 wherein:

the first movable element is adapted for the rotational motion about the first rotational axis in a first direction in response to acceleration along an axis perpendicular to the surface of the substrate; and the second movable element is adapted for the rotational motion about the second rotational axis in a second direction in response to the acceleration, the second direction being opposite to the first direction.

12. The sensor of claim 10, wherein:

the first movable element including the first lateral extension section forms a first L-shaped movable element; and the second movable element including the second lateral extension section forms a second L-shaped movable element, the first and second L-shaped movable elements being arranged in a nested configuration without contact between the first and second L-shaped movable elements.

* * * * *